US009634554B2

(12) United States Patent
Falk et al.

(10) Patent No.: US 9,634,554 B2
(45) Date of Patent: Apr. 25, 2017

(54) SHORT-CIRCUIT SWITCH HAVING SEMICONDUCTOR SWITCH AND ARRANGEMENT FOR SHORT-CIRCUITING A THREE-PHASE ALTERNATING VOLTAGE

(71) Applicant: Raycap, S.A., Athens (GR)

(72) Inventors: Andreas Falk, Kassel (DE); Alexander Krug, Kassel (DE); Max Rothenburger, Baunatal (DE); Gerold Schulze, Kassel (DE)

(73) Assignee: Raycap, S.A., Athens (GR)

( * ) Notice: Subject to any disclaimer, the term of this patent is extended or adjusted under 35 U.S.C. 154(b) by 140 days.

(21) Appl. No.: 14/826,035

(22) Filed: Aug. 13, 2015

(65) Prior Publication Data

US 2016/0087520 A1   Mar. 24, 2016

(30) Foreign Application Priority Data

Sep. 24, 2014 (DE) .................... 20 2014 104 564 U (51) Int. Cl.
*H02H 3/00* (2006.01)
*H02M 1/32* (2007.01)
(Continued)

(52) U.S. Cl.
CPC ............ *H02M 1/32* (2013.01); *H01L 23/051* (2013.01); *H02H 9/041* (2013.01); *H02H 9/044* (2013.01);
(Continued)

(58) Field of Classification Search
USPC .............................................. 361/86–87, 42
See application file for complete search history.

(56) References Cited

U.S. PATENT DOCUMENTS 4,492,975 A * 1/1985 Yamada ................ H01L 25/117
257/726
4,956,696 A 9/1990 Hoppe et al.
(Continued)

FOREIGN PATENT DOCUMENTS

DE 4235329 A1 4/1994
DE 4438593 A1 5/1996
(Continued)

OTHER PUBLICATIONS

European Search Report Corresponding to European Application No. 15185176.3, Dated: Feb. 12, 2016; Foreign Text, 7 Pages, English Translation Thereof, 3 Pages.

*Primary Examiner* — Danny Nguyen
(74) *Attorney, Agent, or Firm* — Myers Bigel, P.A.

(57) ABSTRACT

A short-circuit switch for use with a first electrical conductor and a second electrical conductor includes a controllable semiconductor switch that is configured to short-circuit a voltage present between the first conductor and the second conductor responsive to receipt of a trigger, and a mechanical press-pack structure. The controllable semiconductor switch is a press-pack-type thyristor having a first planar electrode and a second planar electrode on contact sides situated opposite one another. The thyristor is disposed in the mechanical press-pack structure. The mechanical press-pack structure includes: a first terminal electrode that is configured to connect the first planar electrode to the first conductor, wherein the first terminal electrode is resiliently supported by a spring assembly; and a second terminal electrode that is configured to connect the second planar electrode to the second conductor. The press-pack structure forms a protective cover enveloping the thyristor.

14 Claims, 3 Drawing Sheets

(51) Int. Cl.
*H01L 23/051* (2006.01)
*H02H 9/04* (2006.01)
H02H 3/16 (2006.01)
H02H 3/08 (2006.01)

(52) U.S. Cl.
CPC ........ *H01L 2924/0002* (2013.01); *H02H 3/08* (2013.01); *H02H 3/16* (2013.01)

(56) References Cited

U.S. PATENT DOCUMENTS

| | | | |
|---|---|---|---|
| 6,038,119 A | 3/2000 | Atkins et al. | |
| 6,430,020 B1 | 8/2002 | Atkins et al. | |
| 7,433,169 B2 | 10/2008 | Kamel et al. | |
| 8,743,525 B2 | 6/2014 | Xepapas et al. | |
| 2002/0149414 A1* | 10/2002 | Glidden | H03K 17/08144 327/438 |
| 2010/0001698 A1* | 1/2010 | Johnson | H02J 3/1864 323/209 |
| 2013/0335869 A1 | 12/2013 | Xepapas et al. | |
| 2015/0349523 A1 | 12/2015 | Tsovilis et al. | |

FOREIGN PATENT DOCUMENTS

| | | |
|---|---|---|
| DE | 19839422 A1 | 3/2000 |
| DE | 10323220 A1 | 12/2004 |
| DE | 102013103753 A1 | 10/2013 |
| EP | 0516416 A1 | 12/1992 |
| EP | 0785625 A2 | 7/1997 |
| EP | 1116246 A1 | 7/2001 |
| JP | H 05176445 A | 7/1993 |
| SI | 24371 A | 11/2014 |
| WO | WO 2013/044961 A1 | 4/2013 |

\* cited by examiner

SHORT-CIRCUIT SWITCH HAVING SEMICONDUCTOR SWITCH AND ARRANGEMENT FOR SHORT-CIRCUITING A THREE-PHASE ALTERNATING VOLTAGE

RELATED APPLICATION(S)

This application claims priority to German Utility Model Application No. DE 20 2014 104 564.3, filed Sep. 24, 2014, in the German Patent and Trademark Office, the disclosure of which is incorporated herein in its entirety by reference.

FIELD OF THE INVENTION

The invention relates to a short-circuit switch having a controllable semiconductor switch for short-circuiting a voltage present between two conductors, to the use of a press-pack-type thyristor and to an arrangement for short-circuiting a three-phase AC voltage present between three conductors using short-circuit switches having controllable semiconductor switches.

BACKGROUND

DE 10 2013 103 753 A1 states that to protect an inverter of a photovoltaic system in the event of error, it is useful, in addition to separating the inverter from the photovoltaic generator and the AC mains, to short-circuit both the DC voltage of a photovoltaic generator present on the input side, as well as the, in particular, three-phase AC voltage of an AC mains present on the output side, because it is possible to prevent a potentially dangerous flow of current in the inverter more rapidly by short-circuiting than it is by disconnecting. To short-circuit the DC voltage of the photovoltaic generator and the AC voltage of the AC mains, DE 10 2013 103 753 A1 provides DC short-circuit switches and AC short-circuit switches, each having at least one semiconductor switch. However, this publication provides no further detailed information on short-circuit switches.

Currents flowing, in particular, via the AC short-circuit switches according to DE 10 2013 103 753 A1 rapidly achieve a magnitude of 100 kA, because such currents must be undamped in order to accomplish the purpose of protecting the inverter.

Semiconductor switches designed for currents of such magnitude are not available commercially. Dimensioning a short-circuit switch based on semiconductor switches for currents of that magnitude would become very costly.

Available commercially are AC short-circuit switches having a switch contact induced by an explosive charge, this includes the product Arcon by Eaton, or having a switch contact induced by a pre-loaded spring, this includes the product Dehnarc by Dehn. These short-circuit switches are very costly on the one hand, and are relatively slow compared to a semiconductor switch on the other hand.

For power applications, it is known to use so-called press-pack-type semiconductor components. These semiconductor components include planar contact electrodes aligned parallel to one another on contact sides facing away from each other. During assembly of the press-pack-type semiconductor components, these contact electrodes are contacted via planar terminal electrodes, which are resiliently pressed towards one another with high rigidity. In this way, the planar contacting of the semiconductor component is ensured by high flowing power currents even under high thermal stress. The semiconductor components available specifically as press-pack-type components include IGBTs and thyristors, among others.

To form overvoltage arresters capable of carrying large currents, it is known to arrange a varistor disk which can be pressure contacted, in each case in a structure, in which a terminal electrode for connecting a contact electrode of the varistor disk is supported via a spring assembly at another terminal electrode for connecting the other contact electrode of the varistor disk, and in which the structure includes a protective cover enveloping the varistor disk. In the event of destruction of the varistor disk as a result of high flowing currents during the discharge of large overvoltages, the protective cover prevents particles emitted by the varistor disk or gases from being able to leak and cause damage.

EP 1 116 246 B1 describes an overvoltage arrester having a varistor disk capable of being pressure contacted in a structure, in which the protective cover includes a cup which forms the terminal electrode and accommodates the varistor disk, and a piston, which forms the other terminal electrode inserted into the cup and forming the other terminal electrode[sic]. In this configuration, the piston is supported via plate springs and an insulation on an inner flange fixed to the cup. The cup and the piston are formed from aluminum.

A structure of a varistor disk capable of being pressure contacted is known from DE 198 39 422 A1, in which the protective cover is formed from an expandable fabric.

SUMMARY OF THE INVENTION

According to embodiments of the invention, a short-circuit switch for use with a first electrical conductor and a second electrical conductor includes a controllable semiconductor switch that is configured to short-circuit a voltage present between the first conductor and the second conductor responsive to receipt of a trigger, and a mechanical press-pack structure. The controllable semiconductor switch is a press-pack-type thyristor having a first planar electrode and a second planar electrode on contact sides situated opposite one another. The thyristor is disposed in the mechanical press-pack structure. The mechanical press-pack structure includes: a first terminal electrode that is configured to connect the first planar electrode to the first conductor, wherein the first terminal electrode is resiliently supported by a spring assembly; and a second terminal electrode that is configured to connect the second planar electrode to the second conductor. The press-pack structure forms a protective cover enveloping the thyristor.

In some embodiments, the thyristor is dimensioned so that, as a controllable semiconductor switch, it is destroyed by a short-circuit current flowing during the short-circuiting of a voltage present between the first and second conductors. According to some embodiments, the short-circuit current is at least 50 times higher than a rated current for the connecting of which the thyristor is designed. In some embodiments, an allowable $I^2t$-value of the thyristor, in the unit $kA^2$, is at least twice as high as the value of the rated current, in the unit A.

According to some embodiments, the protective cover includes: a cup forming the second terminal electrode and containing the thyristor; and a piston inserted into the cup and forming the first terminal electrode, wherein the piston is supported against the cup by the spring assembly and an insulation. In some embodiments, the insulation is retained in the cup by an inner flange secured to the cup. In some embodiments, the insulation is retained in the cup by a cover screwed to the cup and provided with a cut-out.

According to embodiments of the invention, an arrangement includes three electrical conductors and a plurality of short-circuit switches electrically connected to the three conductors to short-circuit a three-phase AC voltage present between the three conductors. Each of the short-circuit switches includes a controllable semiconductor switch that is configured to short-circuit a voltage present between one of the three conductors and another of the three conductors responsive to receipt of a trigger, and a mechanical press-pack structure. The semiconductor switch is a press-pack-type thyristor having a first planar electrode and a second planar electrode on contact sides situated opposite one another. The thyristor is disposed in the mechanical press-pack structure. The mechanical press-pack structure includes: a first terminal electrode that is configured to connect the first planar electrode to the one of the three conductors, wherein the first terminal electrode is resiliently supported by a spring assembly; and a second terminal electrode that is configured to connect the second planar electrode to the other of the three conductors. The press-pack structure forms a protective cover enveloping the thyristor.

According to some embodiments, three of the short-circuit switches are each connected between two of the three conductors, and line directions of the triggered thyristors are aligned so that of the two triggered thyristors connected to each conductor, one leads toward the conductor and one leads away from the conductor.

According to some embodiments, the press-pack structures are mounted between mutually parallel oriented legs of electrically conductive angular pieces affixed to busbars formed on the conductors and extending parallel to one another.

In some embodiments, two of the press-pack structures are arranged directly between parallel legs of angular pieces affixed directly to the three conductors, and the third press-pack structure is arranged directly between parallel legs of one of the angular pieces affixed directly to one of the conductors, and of an electrically conductive intermediate angular piece affixed directly to another of the angular pieces affixed directly to one of the conductors. In some embodiments, two of the press-pack structures lie on one axis, the angular piece situated between them is U-shaped, and the third press-pack structure lies on an axis parallel thereto. In some embodiments, the intermediate angular piece is supported on the U-shaped angular piece by a non-electrically conductive auxiliary angular piece.

According to embodiments of the invention, a method for forming an arrangement includes: providing three electrical conductors; and electrically connecting a plurality of short-circuit switches to the three conductors to short-circuit a three-phase AC voltage present between the three conductors. Each of the short-circuit switches includes a controllable semiconductor switch that is configured to short-circuit a voltage present between one of the three conductors and another of the three conductors responsive to receipt of a trigger, and a mechanical press-pack structure. The semiconductor switch is a press-pack-type thyristor having a first planar electrode and a second planar electrode on contact sides situated opposite one another. The thyristor is disposed in the mechanical press-pack structure. The mechanical press-pack structure includes: a first terminal electrode that is configured to connect the first planar electrode to the one of the three conductors, wherein the first terminal electrode is resiliently supported by a spring assembly; and a second terminal electrode that is configured to connect the second planar electrode to the other of the three conductors. The press-pack structure forms a protective cover enveloping the thyristor.

Further features, advantages and details of the present invention will be appreciated by those of ordinary skill in the art from a reading of the figures and the detailed description of the preferred embodiments that follow, such description being merely illustrative of the present invention.

BRIEF DESCRIPTION OF THE DRAWINGS

The invention is explained in greater detail below on the basis of specific embodiments with reference to the appended drawings.

DETAILED DESCRIPTION OF EMBODIMENTS OF THE INVENTION

The present invention now will be described more fully hereinafter with reference to the accompanying drawings, in which illustrative embodiments of the invention are shown. In the drawings, the relative sizes of regions or features may be exaggerated for clarity. This invention may, however, be embodied in many different forms and should not be construed as limited to the embodiments set forth herein; rather, these embodiments are provided so that this disclosure will be thorough and complete, and will fully convey the scope of the invention to those skilled in the art.

It will be understood that when an element is referred to as being "coupled" or "connected" to another element, it can be directly coupled or connected to the other element or intervening elements may also be present. In contrast, when an element is referred to as being "directly coupled" or "directly connected" to another element, there are no intervening elements present. Like numbers refer to like elements throughout.

In addition, spatially relative terms, such as "under", "below", "lower", "over", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly.

Well-known functions or constructions may not be described in detail for brevity and/or clarity.

As used herein the expression "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In a short-circuit switch according to the invention having a controllable semiconductor switch for short-circuiting a voltage present between two conductors, the semiconductor switch is a press-pack-type thyristor having planar contact electrodes on contact sides opposite one another, and the thyristor is arranged in a mechanical press-pack structure, in which one terminal electrode for connecting the one contact electrode to the one conductor is resiliently supported via a spring assembly at a terminal electrode for connecting the other contact electrode to the other conductor. This support is inherent to the press-pack structure. This means that it leads fully over parts of the press-pack structure and, accordingly, is present not just in the assembled state of the press-pack structure. It is understood that the control contact of the thyristor must also be contacted. For this, however, it is not necessary to apply a higher contact force as compared to its contact electrodes. This is due to the fact that the ignition current of the thyristor is so small that no large contact surfaces are needed, and that a thyristor remains conductive after ignition and, thus, the triggering signal need not be permanently present.

Cost-effective thyristors, which would be designed for currents in the range of 100 kA and beyond, are in fact unavailable. However, the short-circuit switch according to the invention exploits the fact that a thyristor overloaded by an excessively high current remains conductive between its contact electrodes. With the use of a press-pack-type thyristor, this conductivity of the already'irreversibly destroyed thyristor may be utilized by ensuring the contacting of its contact electrodes even beyond its destruction. In other words, the attempt is not even made in the case of the short-circuit switch according to the invention to design the thyristor for the short-circuit current to be connected. Instead, the thyristor is dimensioned so that, as a controllable semiconductor switch, it is destroyed by a short-circuit current flowing during the short-circuiting of the voltage present between the two conductors. This is readily acceptable, since even known short-circuit switches for high short-circuit currents are provided for one-time use only.

The function of a short-circuit switch according to the invention, unlike, for example, the short-circuit switch having an explosive charge for activating the switch contact may, however, be checked by triggering or igniting the thyristor, so long as the current flowing between the two conductors is so small that the thyristor is not irreversibly overloaded.

The use of a press-pack-type thyristor according to the invention is that of short-circuiting a voltage present between two conductors, the thyristor being dimensioned so that, as a controllable semiconductor switch, it is destroyed by a short-circuit current flowing during the short-circuiting of the voltage present between the two conductors. The thyristor nevertheless continues to conduct the short-circuit current and, in the process, remains further contacted due to its press-pack-type design, i.e., connected to the two conductors.

This is, in particular, applicable if the press-pack-type thyristor having planar contact electrodes is arranged on contact sides opposite one another in a mechanical press-pack structure, in which one terminal electrode, which connects the one contact electrode to the first conductor, is resiliently supported via a spring assembly at a terminal electrode which connects the other contact electrode to the other conductor. In this way, the contact force on the contact electrode is not dependent on the further installation environment of the press-pack-type thyristor.

Specifically, the short-circuit current, which flows past the short-circuit switch according to the invention or during the use of a press-pack-type thyristor according to the invention, may be 50 times higher than a rated current, for the connecting of which the thyristor is designed. The short-circuit current may also be at least 100 times higher or even at least 150 times higher than the rated current. The invention was successfully tested with a short-circuit current, which was 300 times higher than the rated current. Short-circuit currents even beyond that should be possible if the respective thyristor has a sufficiently large allowable $I^2t$-value. This value in the unit $kA^2$ should be at least as high and preferably higher, more preferably at least twice as high as the rated current of the thryistor in the unit A.

In the invention, the press-pack structure also preferably includes a protective cover enveloping the thyristor, in order during its planned overloading and destruction to retain potentially released particles and also gases at least to the extent that they cause no damage to other devices.

Specifically, the protective cover may include a cup which forms the terminal electrode and accommodates the thyristor, and a piston inserted into the cup and forming the other terminal electrode, the piston being supported via the spring assembly and an insulation against an inner flange fixed to the cup. A contacting of the control contact of the thyristor in this configuration may be effected by a transverse bore in the cup, without adversely affecting the function of the protective cover. Except for the additional contacting of the control contact of the thyristor, the press-pack structure with its protective cover may correspond to the prior art for press-pack-type varistors.

In an arrangement according to embodiments of the invention for short-circuiting a three-phase AC voltage present between three conductors using short-circuit switches having controllable semiconductor switches, the short-circuit switches are in each case short circuit switches having press-pack-type thyristors.

Specifically, three of the short-circuit switches may each be connected between two of the three conductors, the line direction of the triggered thyristors being aligned such that of the two triggered thyristors connected to each conductor, one leads toward the conductor and one leads away from the conductor. In this way, each voltage present between the conductors is short-circuited by the triggered, i.e., ignited thyristors. In principle, two pairs of thyristors oriented antiparallel to one another may be provided between one of the conductors and the two other conductors.

With regard to the mechanical design, the press-pack structures of the short circuit switches according to the invention may be mounted between mutually parallel oriented legs of electrically conductive angular pieces affixed to the busbars formed on the conductors and extending parallel to one another. In this configuration, two of the press-pack structures may be arranged directly between parallel legs of angular pieces affixed directly to the three conductors, whereas the third press-pack structure may be arranged directly between parallel legs of one of the angular pieces affixed directly to one of the conductors, and of an electrically conductive intermediate angular piece affixed directly to another of the angular pieces affixed directly to one of the conductors.

This mechanical design results in a particularly compact arrangement when the two of the press-pack structures lie on one axis, the angular piece situated between them being U-shaped, whereas the third press-pack structure lies on an axis parallel thereto. In this case, the intermediate angular piece, which directly abuts the third press-pack structure, may be supported by a non-electrically conductive auxiliary angular piece on the U-shaped angular piece.

Advantageous refinements of the invention will become apparent from the patent claims, the description and the drawings. The advantages of features and of combinations of multiple features cited in the description are merely exemplary and may be effective alternatively or accumulatively, without the advantages necessarily having to be achieved by embodiments according to the invention. The following applies with regard to the disclosure content of the original application documents, without changing the subject matter of the appended claims: additional features are indicated in the drawings—in particular the geometries depicted and the dimensions of multiple components relative to one another, as well as to their relative configuration and their operative connection. The combination of features of different embodiments of the invention or features of different patent claims may also differ from the selected dependencies and is hereby suggested. This also applies to those features depicted in separate drawings or mentioned in the description thereof. These features may also be combined with features of different patent claims. Features cited in the patent claims may also be omitted for other embodiments of the invention.

The features cited in the patent claims and the description are to be understood in terms of their number in that precisely this number or a number larger than the cited number exists, without the need for the express use of the adverb "at least". If, for example, an element is referred to, this is to be understood in that precisely one element, two elements or more elements exist. These features may be supplemented by other features or may be the only features of which the respective product consists.

Figure 1:
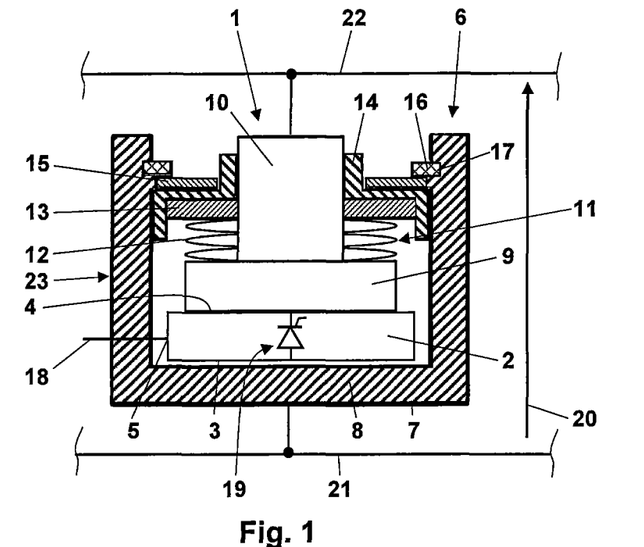
FIG. 1 is a longitudinal section through a short-circuit switch according to embodiments of the invention, its use is also being schematically indicated.

A short-circuit switch 1 according to embodiments of the invention is depicted in FIG. 1 and comprises a semiconductor switch in the form of a thyristor 2. The thyristor 2 is of the press-pack type having large area contact electrodes 3 and 4 on contact sides situated opposite one another, and a further contact terminal 5 for controlling, i.e., triggering or igniting the thyristor 2.

The press-pack-type thyristor 2 is arranged in a press-pack structure 6. The press-pack structure 6 comprises a cup 7, which forms a terminal electrode 8, which abuts the one contact electrode 3 of the thyristor 2. The other contact electrode 4 is contacted by a punch or piston 10 forming another terminal electrode 9. The cup 7 forms a chamber or cavity within which the thyristor 2 and terminal electrode 9 are disposed or contained, as shown in FIG. 1. The piston 10 in this case, like the cup 7, is also formed of aluminum. In principle, it may also be formed from another good electrically conductive material.

In order to apply a contact force or load to the contact electrodes 3 and 4 between the terminal electrodes 8 and 9, the piston 10 is resiliently supported via a spring assembly 11 on the cup 7. The spring assembly 11 comprises plate springs 12, which are supported directly against a metal plate 13, which abuts an insulator member or insulation 14 to the rear. The springs 12 spring bias the terminal electrode 9 toward the terminal electrode 8. The insulation 14, in turn, is supported against a metal plate 15, which is supported via a snap ring 16 against the cup 7, the snap ring 16 engaging in a groove 17 on the circumference of the cup 7. The resilient support of the piston 10 relative to the cup 7 and, therefore, the terminal electrode 9 relative to the terminal electrode 8 occurs in the press-pack structure 6, i.e., separately from the installation of the press-pack structure 6 during the use of the short-circuit switch 1. A connecting line 18 passes through the cup 7 from a control not depicted herein to the control contact terminal 5 of the thyristor 2.

By triggering, i.e., igniting the thyristor via a triggering signal through the control line 18, the former becomes conductive in the direction indicated by the switch symbol 19 for a thyristor, and is therefore able to short-circuit a voltage 20, which is present between two lines 21 and 22, to which the terminal electrodes 8 and 9 are connected. The now flowing short-circuit current may exceed the rated flow of the thyristor 2 by more than 100 times, without loss of function of the short-circuit switch 1, because even the thyristor 2, irreversibly destroyed by such a strong short-circuit current, remains conductive, and this conductivity may be further utilized in the case of the short-circuit switch 1 as a result of the design of press-pack-type thyristor 2 and its arrangement in the press-pack structure 6. The protective cover 23 around the thyristor 2 formed by the press-pack structure 6 with the cup 7 and the parts affixed thereto ensures that particles and gases exiting the thyristor 2 when it is overloaded are retained and that no damage may be caused in the area around the short-circuit switch 1.

Figure 2:
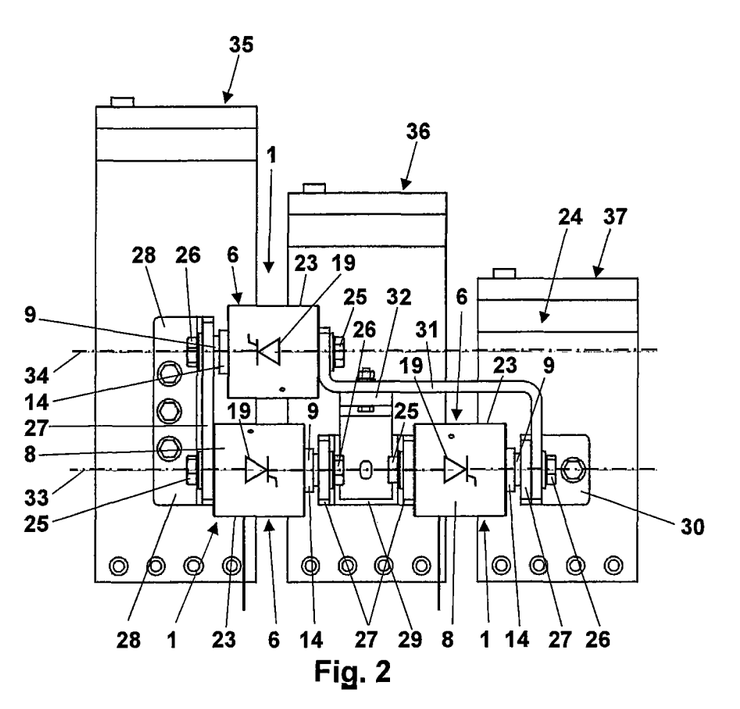
FIG. 2 shows an arrangement according to embodiments of the invention for short-circuiting a three-phase AC voltage in a view from above.
Figure 3:
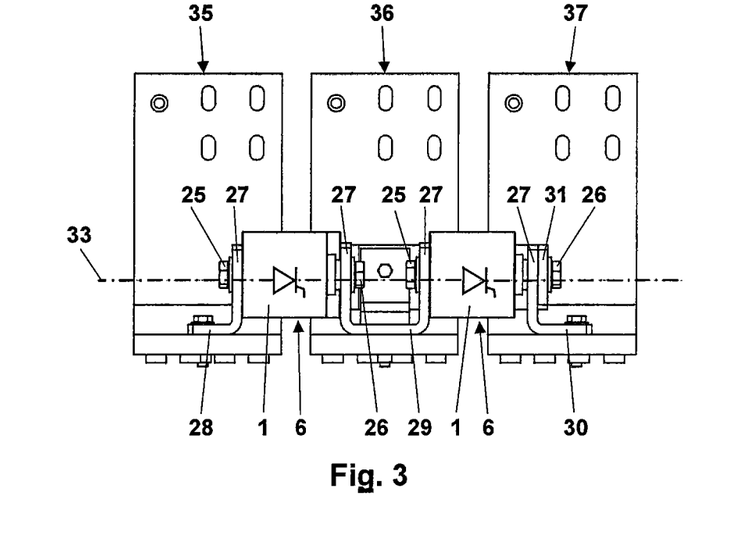
FIG. 3 shows a side view of the arrangement according to FIG. 2 from a first direction.
Figure 4:
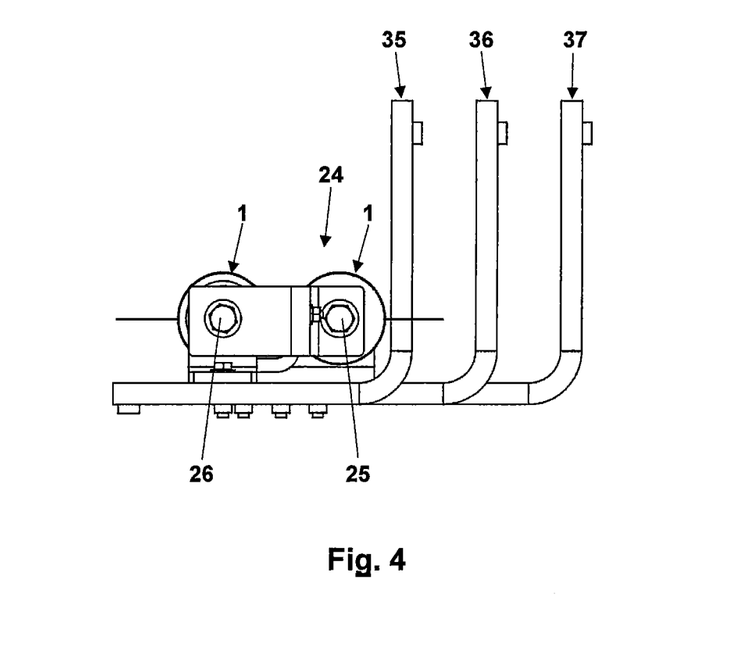
FIG. 4 shows a side view of the arrangement according to FIG. 2 and FIG. 3 from a second direction.

FIG. 2 through FIG. 4 show an arrangement 24 having three protective switches 1 according to FIG. 1 from different viewing directions. The press-pack structures 6 are mounted with fastening screws 25 and 26 on mutually parallel extending legs 27 of angular pieces 28 through 31. In this case, each screw 25 contacts a terminal electrode 8 and each screw 26 contacts a terminal electrode 9. The angular pieces 27 through 30 are provided for direct screw fastening to busbars 35, 36 and 37, between which the three-phase AC voltage is present, which is to be short-circuited with the short-circuit switches 1. The angular piece 31 is an intermediate angular piece, which is attached to the angular piece 30, and which is supported via, unlike the angular pieces 28 through 31 non-electrically conductive, an auxiliary angular piece 32 on the U-shape-designed angular piece 29. The press-pack structures 6 arranged directly between the angular pieces 28, 29 and 30 are situated on one axis 33, the third press-pack structure 6 abutting the intermediate angular piece 31, on a parallel axis 34. This results in an overall compact spatial arrangement of the short-circuit switches 1.

Figure 5:
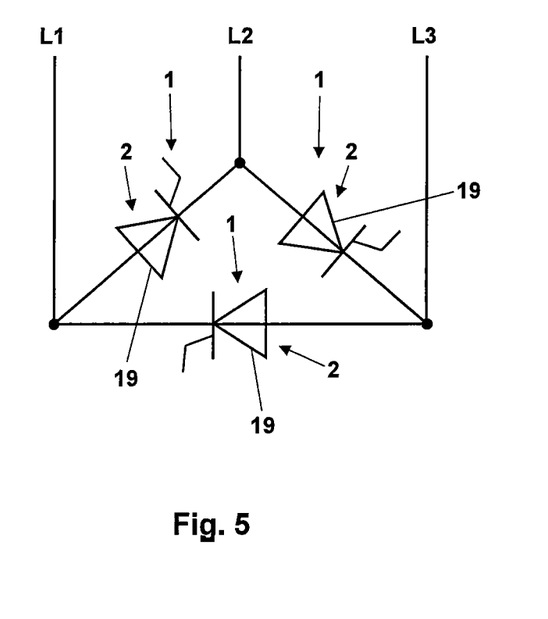
FIG. 5 is an equivalent circuit diagram of the arrangement according to FIG. 1 through FIG. 4.

FIG. 5 shows an electrically equivalent circuit diagram of the arrangement 24 according to FIG. 2 through FIG. 4 between three conductors L1 through L3. Each of the conductors L1 through L3 is connected to each of the other two conductors, in each case via one of the thyristors 2. In this case, the line directions of the ignited thyristors 2 each extend, one toward the respective conductor and one away from the respective conductor. Thus, each voltage present between the conductors L1 through L3 is short-circuited via the thyristors 2 when all thyristors 2 are ignited, specifically, in the case of the design of the short-circuit switches 1 according to the invention, even when the thyristors 2 themselves are already irreversibly destroyed.

Figure 6:
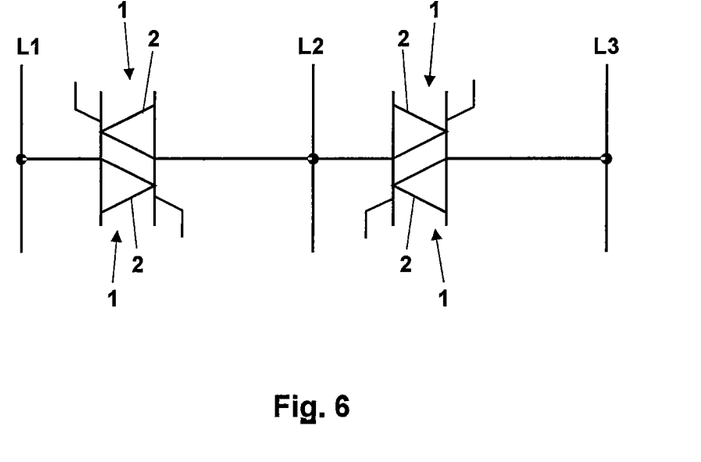
FIG. 6 is an equivalent circuit diagram for an alternative arrangement according to embodiments of the invention.

FIG. 6 shows an equivalent circuit diagram for an alternative arrangement of four short-circuit switches 1, each having one thyristor 2 for short-circuiting a three-phase AC voltage between three conductors L1 through L3. Here, two each of the thyristors 2 are arranged as anti-parallel pairs between two of the conductors L1 through L3. These two anti-parallel aligned thyristors may be combined to form one bi-directional short-circuit switch. However, they must then be individually arranged in the latter, such that the unidirectional short-circuit switch remains conductive in its respective line direction. For that purpose, they must be resiliently impinged individually.

Many alterations and modifications may be made by those having ordinary skill in the art, given the benefit of present disclosure, without departing from the spirit and scope of the invention. Therefore, it must be understood that the illustrated embodiments have been set forth only for the purposes of example, and that it should not be taken as limiting the invention as defined by the following claims. The following claims, therefore, are to be read to include not only the combination of elements which are literally set forth but all equivalent elements for performing substantially the same function in substantially the same way to obtain substantially the same result. The claims are thus to be understood to include what is specifically illustrated and described above, what is conceptually equivalent, and also what incorporates the essential idea of the invention.

What is claimed is:

1. A short-circuit switch for use with a first electrical conductor and a second electrical conductor, the short-circuit switch comprising:
   a controllable semiconductor switch that is configured to short-circuit a voltage present between the first conductor and the second conductor responsive to receipt of a trigger, wherein the semiconductor switch is a press-pack-type thyristor having a first planar electrode and a second planar electrode on contact sides situated opposite one another; and
   a mechanical press-pack structure, wherein the thyristor is disposed in the mechanical press-pack structure, and the mechanical press-pack structure includes:
      a first terminal electrode that is configured to connect the first planar electrode to the first conductor, wherein the first terminal electrode is resiliently supported by a spring assembly; and
      a second terminal electrode that is configured to connect the second planar electrode to the second conductor;
      wherein the press-pack structure forms a protective cover enveloping the thyristor.

2. The short-circuit switch according to claim 1, wherein the thyristor is dimensioned so that, as a controllable semiconductor switch, it is destroyed by a short-circuit current flowing during the short-circuiting of a voltage present between the first and second conductors.

3. The short-circuit switch according to claim 2, wherein the short-circuit current is at least 50 times higher than a rated current for the connecting of which the thyristor is designed.

4. The short-circuit switch according to claim 3, wherein an allowable $I^2t$-value of the thyristor, in the unit $kA^2$, is at least twice as high as the value of the rated current, in the unit A.

5. The short-circuit switch according to claim 1, wherein the protective cover includes:
   a cup forming the second terminal electrode and containing the thyristor;
   and a piston inserted into the cup and forming the first terminal electrode, wherein the piston is supported against the cup by the spring assembly and an insulation.

6. The short-circuit switch according to claim 5, wherein the insulation is retained in the cup by an inner flange secured to the cup.

7. The short-circuit switch according to claim 5, wherein the insulation is retained in the cup by a cover screwed to the cup and provided with a cut-out.

8. An arrangement comprising:
   three electrical conductors; and
   a plurality of short-circuit switches electrically connected to the three conductors to short-circuit a three-phase AC voltage present between the three conductors;
   wherein each of the short-circuit switches includes:
      a controllable semiconductor switch that is configured to short-circuit a voltage present between one of the three conductors and another of the three conductors responsive to receipt of a trigger, wherein the semiconductor switch is a press-pack-type thyristor having a first planar electrode and a second planar electrode on contact sides situated opposite one another; and
      a mechanical press-pack structure, wherein the thyristor is disposed in the mechanical press-pack structure, and the mechanical press-pack structure includes:
         a first terminal electrode that is configured to connect the first planar electrode to the one of the three conductors, wherein the first terminal electrode is resiliently supported by a spring assembly; and
         a second terminal electrode that is configured to connect the second planar electrode to the other of the three conductors;
         wherein the press-pack structure forms a protective cover enveloping the thyristor.

9. The arrangement according to claim 8, wherein:
   three of the short-circuit switches are each connected between two of the three conductors; and
   line directions of the triggered thyristors are aligned so that of the two triggered thyristors connected to each conductor, one leads toward the conductor and one leads away from the conductor.

10. The arrangement according to claim 8, wherein the press-pack structures are mounted between mutually parallel oriented legs of electrically conductive angular pieces affixed to busbars formed on the conductors and extending parallel to one another.

11. The arrangement according to claim 10, wherein:
   two of the press-pack structures are arranged directly between parallel legs of angular pieces affixed directly to the three conductors; and
   the third press-pack structure is arranged directly between parallel legs of one of the angular pieces affixed directly to one of the conductors, and of an electrically conductive intermediate angular piece affixed directly to another of the angular pieces affixed directly to one of the conductors.

12. The arrangement according to claim 11, wherein:

two of the press-pack structures lie on one axis;

the angular piece situated between them is U-shaped; and the third press-pack structure lies on an axis parallel thereto.

13. The arrangement according to claim 12, wherein the intermediate angular piece is supported on the U-shaped angular piece by a non-electrically conductive auxiliary angular piece.

14. A method for forming an arrangement, the method comprising:

providing three electrical conductors; and electrically connecting a plurality of short-circuit switches to the three conductors to short-circuit a three-phase AC voltage present between the three conductors;

wherein each of the short-circuit switches includes:

a controllable semiconductor switch that is configured to short-circuit a voltage present between one of the three conductors and another of the three conductors responsive to receipt of a trigger, wherein the semiconductor switch is a press-pack-type thyristor having a first planar electrode and a second planar electrode on contact sides situated opposite one another; and a mechanical press-pack structure, wherein the thyristor is disposed in the mechanical press-pack structure, and the mechanical press-pack structure includes:

a first terminal electrode that is configured to connect the first planar electrode to the one of the three conductors, wherein the first terminal electrode is resiliently supported by a spring assembly; and a second terminal electrode that is configured to connect the second planar electrode to the other of the three conductors;

wherein the press-pack structure forms a protective cover enveloping the thyristor.

\* \* \* \* \*

UNITED STATES PATENT AND TRADEMARK OFFICE
CERTIFICATE OF CORRECTION

PATENT NO. : 9,634,554 B2  
APPLICATION NO. : 14/826035  
DATED : April 25, 2017  
INVENTOR(S) : Falk et al.

Page 1 of 1

It is certified that error appears in the above-identified patent and that said Letters Patent is hereby corrected as shown below:

On the Title Page

(30) Foreign Application Priority Data:  
Please correct "20 2014 104 564 U" to read -- 20 2014 104 564.3 --

Signed and Sealed this  
Thirty-first Day of July, 2018

Andrei Iancu  
*Director of the United States Patent and Trademark Office*